(12) United States Patent
Ishii et al.

(10) Patent No.: US 9,427,892 B2
(45) Date of Patent: Aug. 30, 2016

(54) LIQUID EJECTION HEAD AND MANUFACTURING METHOD FOR THE SAME

(71) Applicant: CANON KABUSHIKI KAISHA, Tokyo (JP)

(72) Inventors: Miho Ishii, Kawasaki (JP); Ken Ikegame, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/641,702

(22) Filed: Mar. 9, 2015

(65) Prior Publication Data

US 2015/0273825 A1 Oct. 1, 2015

(30) Foreign Application Priority Data

Mar. 28, 2014 (JP) ................... 2014-068276

(51) Int. Cl.
| | |
|---|---|
| *B41J 2/14* | (2006.01) |
| *B41J 2/16* | (2006.01) |
| *B29C 33/00* | (2006.01) |
| *G03F 7/00* | (2006.01) |

(52) U.S. Cl.
CPC .......... *B29C 33/0061* (2013.01); *B41J 2/1404* (2013.01); *B41J 2/1603* (2013.01); *B41J 2/1606* (2013.01); *B41J 2/1631* (2013.01); *B41J 2/1639* (2013.01); *B41J 2/1645* (2013.01); *G03F 7/00* (2013.01)

(58) Field of Classification Search
CPC ...... B41J 2/1433; B41J 2/162; B41J 2/1626; B41J 2/1631; B41J 2/1637; B41J 2/1628; B41J 2/1629; B29C 33/0061
See application file for complete search history.

(56) References Cited

U.S. PATENT DOCUMENTS

| | | | |
|---|---|---|---|
| 8,975,003 B2 | 3/2015 | Takahashi et al. | |
| 2005/0045582 A1* | 3/2005 | Huang ....................... | B41J 2/16 216/27 |
| 2006/0061621 A1* | 3/2006 | Seto ........................ | B41J 2/1433 347/45 |
| 2011/0074871 A1* | 3/2011 | Uchiyama .............. | B41J 2/1606 347/28 |
| 2011/0074881 A1* | 3/2011 | Uchiyama .............. | B41J 2/1606 347/45 |
| 2012/0086751 A1* | 4/2012 | Nakamoto ........... | B41J 2/14209 347/20 |
| 2013/0244352 A1* | 9/2013 | Takahashi ......... | H01L 21/30604 438/21 |

FOREIGN PATENT DOCUMENTS

JP 4-234665 A 8/1992

* cited by examiner

*Primary Examiner* — Matthew Luu
*Assistant Examiner* — Patrick King
(74) *Attorney, Agent, or Firm* — Fitzpatrick, Cella, Harper & Scinto

(57) ABSTRACT

A manufacturing method for a liquid ejection head including: a substrate; an ejection orifice forming member having an ejection orifice on the substrate; and a surface layer having a recess that has a bottom portion communicating with the ejection orifice and an opening held in contact with an outside and having a width larger than a width of the ejection orifice, the surface layer being formed on the forming member, the method including: forming a first resin layer serving as the forming member by applying a negative photosensitive resin composition A onto the substrate; forming a second resin layer as the surface layer by applying a negative photosensitive resin composition B having sensitivity lower than sensitivity of the composition A onto the first resin layer; subjecting the first and the second resin layers to pattern exposure collectively; and subjecting the first and the second resin layers to development collectively.

7 Claims, 6 Drawing Sheets

FIG. 4
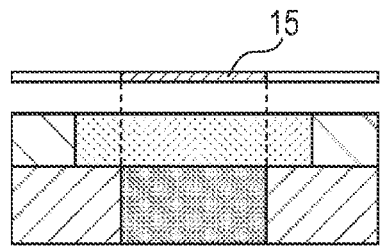
FIG. 5A    FIG. 5B    FIG. 5C
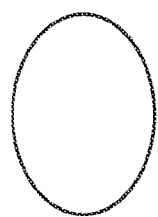    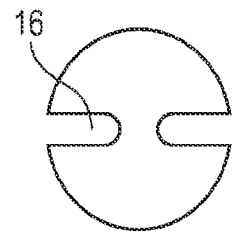

LIQUID EJECTION HEAD AND MANUFACTURING METHOD FOR THE SAME

BACKGROUND OF THE INVENTION

1. Field of the Invention

The present invention relates to a liquid ejection head and a manufacturing method for the same.

2. Description of the Related Art

As a liquid ejection head configured to eject a liquid, there is given an ink jet recording head that performs recording by ejecting ink onto a recording medium. An ink jet recording apparatus including an ink jet recording head performs recording onto a recording medium in a state in which the ink jet recording head and the recording medium are brought close to each other, and hence ejected ink may splash back to adhere to an ejection orifice surface of the ink jet recoding head. Further, in the case where the ink remains on the ejection orifice so as to have high viscosity or where fibers, dust, and the like of the recording medium adhere to the ejection orifice surface, the ejection orifice may be clogged. In this case, the ejection pressure of the ink decreases, and hence the ink adheres to the ejection orifice surface. When the ink adheres to the ejection orifice surface, the ink is transferred onto the recording medium so as to degrade recording quality. In order to solve this problem, the ejection orifice surface of the ink jet recording head is wiped with a blade.

When the number of times of blade wiping of the ink jet recording head increases, the ejection orifice surface is worn away. In particular, in the case where an end portion of the ejection orifice in which a meniscus of the ink is formed is degraded to change the shape of the ejection orifice, it becomes difficult to eject the ink stably. In Japanese Patent Application Laid-Open No. H04-234665, the protection of an ejection orifice is enhanced by bonding a metal plate having a hole corresponding to the ejection orifice to a substrate surface having the ejection orifice so as to set the substrate surface at a lower position with respect to a periphery through use of a level difference.

SUMMARY OF THE INVENTION

According to one aspect of the present invention, there is provided a manufacturing method for a liquid ejection head, the liquid ejection head including: a substrate; an ejection orifice forming member having an ejection orifice configured to eject a liquid, the ejection orifice forming member being formed on the substrate; and a surface layer having a recess that has a bottom portion communicating with the ejection orifice and an opening held in contact with an outside and having a width larger than a width of the ejection orifice, the surface layer being formed on the ejection orifice forming member, the manufacturing method including: forming a first resin layer serving as the ejection orifice forming member by applying a negative photosensitive resin composition A onto the substrate; forming a second resin layer serving as the surface layer by applying a negative photosensitive resin composition B having sensitivity lower than sensitivity of the negative photosensitive resin composition A onto the first resin layer; subjecting the first resin layer and the second resin layer to pattern exposure collectively; and subjecting the first resin layer and the second resin layer to development treatment collectively after the pattern exposure.

According to another aspect of the present invention, there is provided a liquid ejection head, including: a substrate; an ejection orifice forming member having an ejection orifice configured to eject a liquid, the ejection orifice forming member being formed on the substrate; and a surface layer having a recess that has a bottom portion communicating with the ejection orifice and an opening held in contact with an outside and having a width larger than a width of the ejection orifice, the surface layer being formed on the ejection orifice forming member, the ejection orifice forming member and the surface layer including a cured product of a negative photosensitive resin.

Further features of the present invention will become apparent from the following description of exemplary embodiments with reference to the attached drawings.

BRIEF DESCRIPTION OF THE DRAWINGS

FIG. 4 is a sectional view illustrating another example of the manufacturing method for a liquid ejection head according to the present invention.

FIGS. 5A, 5B, and 5C are top views each illustrating an example of the shape of an ejection orifice of the liquid ejection head to be manufactured by the method according to the present invention.

DESCRIPTION OF THE EMBODIMENTS

Figure 1A:
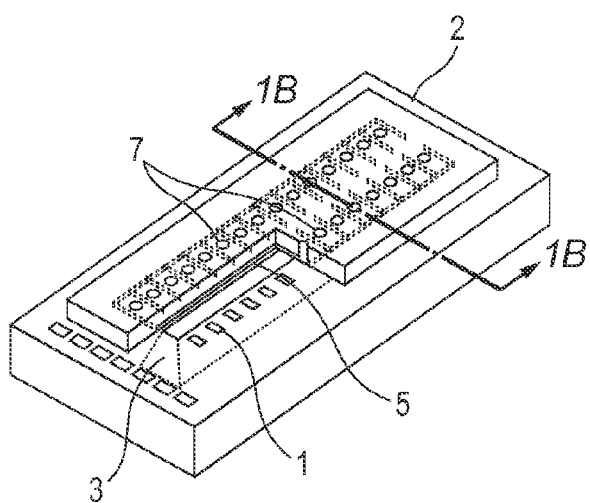
FIGS. 1A and 1B are respectively a perspective view and a sectional view of a liquid ejection head to be manufactured by a method according to the present invention.

In the method involving forming a level difference by bonding the metal plate to the ejection orifice surface described in Japanese Patent Application Laid-Open No. H04-234665, it is necessary to align the ejection orifice with the hole of the metal plate so that they are concentric with each other, and thus the method has a problem in precision.

The present invention is directed to providing a method capable of manufacturing a liquid ejection head having an ejection orifice excellent in blade resistance with high precision.

[Manufacturing Method for Liquid Ejection Head]

A manufacturing method for a liquid ejection head according to the present invention is a manufacturing method for a liquid ejection head, the liquid ejection head including: a substrate; an ejection orifice forming member having an ejection orifice configured to eject a liquid, the ejection orifice forming member being formed on the substrate; and a surface layer having a recess that has a bottom portion communicating with the ejection orifice and an opening held in contact with an outside and having a width larger than a width of the ejection orifice, the surface layer being formed on the ejection orifice forming member, the manufacturing method including: forming a first resin layer serving as the ejection orifice forming member by applying a negative photosensitive resin composition A onto the substrate; forming a second resin layer serving as the surface layer by applying a negative photosensitive resin composition B having sensitivity lower than sensitivity of the negative photosensitive resin composition A onto the first resin layer; subjecting the first resin layer and the second resin layer to pattern exposure collectively; and subjecting the first resin layer and the second resin layer to development treatment collectively after the pattern exposure.

In the method according to the present invention, the negative photosensitive resin composition B having sensitivity lower than that of the negative photosensitive resin composition A that is a material for the ejection orifice forming member is used as a material for the surface layer having the recess. Thus, when the first resin layer and the second resin layer are subjected to the pattern exposure collectively, a pattern of the recess having the opening with a width larger than a pattern of the ejection orifice formed in the first resin layer can be formed in the second resin layer easily with good precision. Accordingly, in the method according to the present invention, the liquid ejection head having the ejection orifice excellent in blade resistance can be manufactured simply with high precision. An embodiment of the present invention is described hereinafter with reference to the drawings. It is to be noted that the liquid ejection head to be manufactured by the method according to the present invention may be used as, for example, an ink jet recording head that performs recording onto a recording medium by ejecting ink.

Figure 1B:
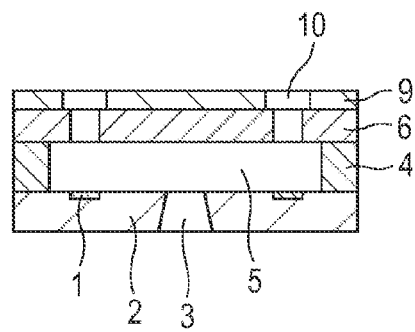

FIG. 1A is a perspective view illustrating a liquid ejection head to be manufactured by a method according to the present invention. Further, FIG. 1B is a sectional view illustrating a cross section taken along the line 1B-1B of FIG. 1A. In the liquid ejection head illustrated in FIG. 1A, energy generating elements 1 configured to generate energy to be used for ejecting a liquid such as ink are arranged on a substrate 2 at a predetermined pitch. In the substrate 2, a supply port 3 configured to supply a liquid is formed between two rows of the energy generating elements 1. A flow path forming member 4 configured to form a flow path 5 of a liquid is formed on the substrate 2. Further, an ejection orifice forming member 6 having ejection orifices 7 configured to eject a liquid is formed on the flow path forming member 4. It is to be noted that the flow path forming member 4 and the ejection orifice forming member 6 may be integrated, and in this case, the ejection orifice forming member 6 also serves as the flow path forming member 4. That is, in this case, the ejection orifice forming member 6 forms the ejection orifices 7 and the flow path 5. Further, a surface layer 9 having recesses 10 is formed on the ejection orifice forming member 6. A bottom portion of the recess 10 communicates with the ejection orifice 7. Further, the width of an opening of the recess 10 held in contact with an outside is larger than that of the ejection orifice 7. It is to be noted that the width of the ejection orifice 7 refers to the width of the opening of the ejection orifice 7 held in contact with the recess 10.

Figure 2A:
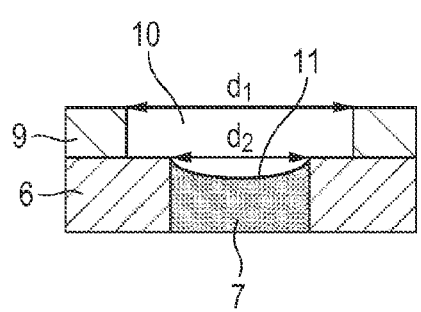
FIGS. 2A and 2B are sectional views illustrating an ejection state of a liquid droplet in the liquid ejection head to be manufactured by the method according to the present invention.
Figure 2B:
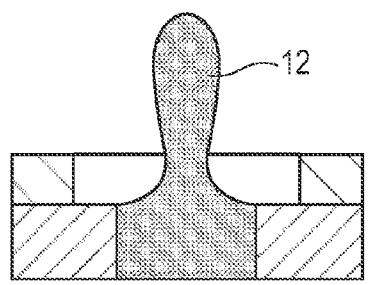

In the liquid ejection head, a pressure generated by the energy generating elements 1 is applied to a liquid supplied from the supply port 3 through the flow path 5. Thus, as illustrated in FIG. 2A, a meniscus 11 is formed in the opening of the ejection orifice 7, and the liquid is ejected as a liquid droplet 12 as illustrated in FIG. 2B. In the liquid ejection head, the opening of the ejection orifice 7 is formed at a position lower than a periphery due to the presence of the surface layer 9. Therefore, the periphery of the opening of the ejection orifice 7 is less likely to be directly influenced by mechanical damage through blade wiping, paper rubbing, paper jam, or the like, and hence the ejection orifice 7 can be protected.

It is preferred that a width $d_1$ of the opening of the recess 10 held in contact with an outside in FIG. 2A be 1.3 to 2.0 times a width $d_2$ of the ejection orifice 7. When a $d_1/d_2$ ratio is 1.3 or more, a blade can enter the recess 10 so as to remove foreign matters sufficiently. Further, when the $d_1/d_2$ is 2.0 or less, the blade does not directly strike the periphery of the opening of the ejection orifice 7 with a strong force, and thus the ejection orifice 7 can be prevented from being degraded. The $d_1/d_2$ ration is preferably 1.4 or more and 1.9 or less, more preferably 1.5 or more and 1.8 or less. Further, the depth (hereinafter sometimes referred to as "$d_3$") of the recess 10, that is, the thickness of the surface layer 9 is preferably 0.1 times or more and 1.3 times or less of $d_1$, more preferably 0.5 times or more and 1.3 times or less of $d_1$, still more preferably 0.8 times or more and 1.3 times or less of $d_1$, from the viewpoint of enhancing the blade resistance.

It is to be noted that in the case where the recess 10 and the ejection orifice 7 have a circular shape, $d_1$ indicates a diameter of the opening of the recess 10 held in contact with an outside, and $d_2$ indicates a diameter of the ejection orifice 7. Further, in the case where the recess 10 and the ejection orifice 7 do not have a circular shape, $d_1$ indicates a maximum width of the opening of the recess 10 held in contact with an outside, and $d_2$ indicates a maximum width of the ejection orifice 7.

Figure 3A:
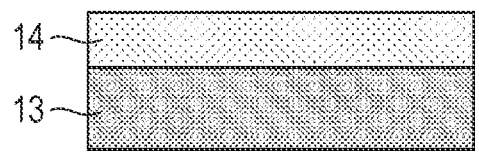
FIGS. 3A, 3B, and 3C are sectional views illustrating an example of a manufacturing method for a liquid ejection head according to the present invention.
Figure 3B:
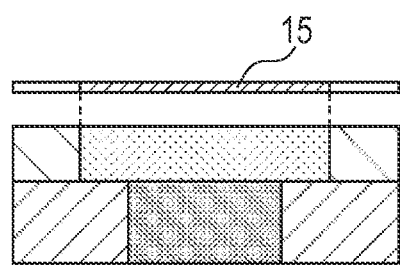
Figure 3C:
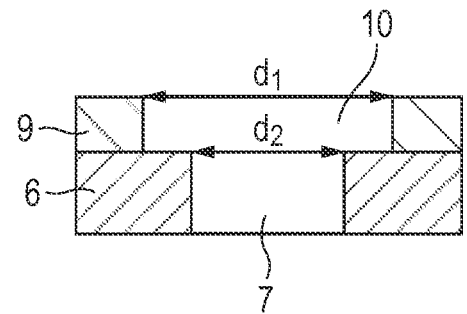

FIGS. 3A to 3C are sectional views of a part of a cross section taken along the line 1B-1B of FIG. 1A, illustrating an example of a manufacturing method for a liquid ejection head according to the present invention.

First, the negative photosensitive resin composition A is applied onto a substrate (not shown) so as to form a first resin layer 13 serving as the ejection orifice forming member. It is required that a cured product of the first resin layer 13 have mechanical strength, resistance to a liquid such as ink, and adhesion to an underlayer. Further, it is required that the resolution of the cured product as a photolithography material be considered. As a material that satisfies those characteristics, it is preferred that the negative photosensitive resin composition A be a cationically polymerizable epoxy resin composition. It is preferred that the cationically polymerizable epoxy resin composition be a photocationically polymerizable epoxy resin composition containing an epoxy resin such as a bisphenol-type epoxy resin, a phenol novolac-type epoxy resin, a cresol novolac-type epoxy resin, or a polyfunctional epoxy resin having an oxycyclohexane skeleton. One kind of the compositions may be used alone, or two or more kinds thereof may be used in combination.

Further, it is preferred that the negative photosensitive resin composition A contain a cationically polymerizable resin having two or more epoxy groups and a photoacid generator, which absorbs light to generate an acid. When the cationically polymerizable resin having two or more epoxy groups is used for the negative photosensitive resin composition A, the negative photosensitive resin composition A can be three-dimensionally cross-linked during curing, and the cured product of the first resin layer 13 can satisfy the above-mentioned characteristics. As commercially available products of the cationically polymerizable resin having two or more epoxy groups, there are given, for example: "Celloxide 2021", "GT-300 series", "GT-400 series", and "EHPE3150" (trade names; manufactured by Daicel Corporation); "157S70" (trade name; manufactured by Mitsubishi Chemical Corporation); and "EPICLON N-865" (trade name; manufactured by DIC Corporation). Examples of the photoacid generator include a sulfonic acid compound, a diazomethane compound, a sulfonium salt compound, an iodonium salt compound, and a disulfone-based compound. As commercially available products of the photoacid generator, there are given, for example: "ADEKA OPTOMER SP-170", "ADEKA OPTOMER SP-172", and "SP-150" (trade names; manufactured by ADEKA CORPORATION); "BBI-103" and "BBI-102" (trade names; manufactured by Midori Kagaku Co., Ltd.); and "IBPF", "IBCF", "TS-01", and "TS-91" (trade names; manufactured by SANWA Chemical Co., Ltd). One kind of the cationically polymerizable resins and the photoacid generators may be used alone, or two or more kinds thereof may be used in combination. Although depending on the exposure conditions, the content of the photoacid generator may be, for example, from 0.5 to 4.0 parts by mass in the case where the content of the cationically polymerizable resin is 100 parts by mass.

Further, the negative photosensitive resin composition A may contain a basic substance such as an amine, a photosensitizing substance such as an anthracene derivative, a silane coupling agent, and the like for the purpose of improving the photolithography performance, adhesion performance, and the like. In addition, the negative photosensitive resin composition A may contain a solvent such as propylene glycol 1-methyl ether acetate (PGMEA) or ethanol for the purpose of improving the application property. In addition, as the negative photosensitive resin composition A, there may be used, for example, "SU-8 series" and "KMPR-1000" (trade names; manufactured by Kayaku MicroChem Corporation) and "TMMR S2000" and "TMMF S2000" (trade names; manufactured by TOKYO OHKA KOGYO CO., LTD.), which are commercially available as negative resists.

There is no particular limitation on a method of applying the negative photosensitive resin composition A onto the substrate. For example, the negative photosensitive resin composition A may be applied onto the substrate by a spin coating method, a slit coating method, or the like. It is to be noted that in the method according to the present invention, the negative photosensitive resin composition A may be applied directly onto the substrate surface or onto a layer serving as the flow path forming member formed on the substrate.

Next, the negative photosensitive resin composition B having sensitivity lower than that of the negative photosensitive resin composition A is applied onto the first resin layer 13 so as to form a second resin layer 14 serving as the surface layer (FIG. 3A). A cured product of the second resin layer 14 is required to have characteristics similar to those of the cured product of the first resin layer 13. Therefore, as the negative photosensitive resin composition B, a material similar to that for the negative photosensitive resin composition A may be used. It is to be noted that a negative photosensitive resin A contained in the negative photosensitive resin composition A and a negative photosensitive resin B contained in the negative photosensitive resin composition B may be the same as or different from each other. Further, the photoacid generator contained in the negative photosensitive resin composition A and a photoacid generator contained in the negative photosensitive resin composition B may be the same as or different from each other.

Further, in the present invention, as described later, in order to set $d_1$ to be larger than $d_2$ when subjecting the second resin layer 14 to pattern exposure and development collectively with the first resin layer 13, it is necessary that the negative photosensitive resin composition B have sensitivity lower than that of the negative photosensitive resin composition A. The sensitivity of the negative photosensitive resin composition can be adjusted by appropriately selecting the kind and amount of the photoacid generator contained in the negative photosensitive resin composition. For example, in the case where the negative photosensitive resin compositions A and B contain photoacid generators of the same kind, the sensitivity of the negative photosensitive resin composition B can be set to be lower than that of the negative photosensitive resin composition A by setting the amount of the photoacid generator contained in the negative photosensitive resin composition B to be smaller than that of the photoacid generator contained in the negative photosensitive resin composition A. Further, in this case, the $d_1/d_2$ ratio can be adjusted by appropriately selecting the amounts of the photoacid generators. It is to be noted that it is confirmed that the sensitivity of the negative photosensitive resin composition B is lower than that of the negative photosensitive resin composition A, based on the area of a void pattern obtained by subjecting each composition to pattern exposure and development under the same condition. That is, in the present invention, when a void pattern is created by development, the area of the void pattern in the negative photosensitive resin composition B is larger than that in the negative photosensitive resin composition A.

Further, it is preferred that the negative photosensitive resin composition B contain a water-repellent agent. When the negative photosensitive resin composition B, that is, the surface layer contains a water-repellent agent, a wall surface of the recess 10 and a surface of the surface layer may be subjected to water-repellent treatment so as to enhance water repellency. It is preferred that the water-repellent agent contain a fluorine-containing compound. Examples of the water-repellent agent include a cationically polymerizable perfluoroalkyl composition and a cationically polymerizable perfluoropolyether composition. Specifically, as the water-repellent agent, there is given a condensate containing a hydrolyzable silane compound having a fluorine-containing group and a hydrolyzable silane compound having a cationically polymerizable group.

As a method of applying the negative photosensitive resin composition B onto the first resin layer 13, a method similar to the method of applying the negative photosensitive resin composition A onto the substrate may be used. The thickness of the second resin layer 14 may be set to, for example, 0.1 µm or more and 5 µm or less.

Next, the first resin layer 13 and the second resin layer 14 are subjected to pattern exposure collectively through a mask 15 having a pattern of the recess (FIG. 3B). After that, the exposed portion is cured by performing post exposure bake (PEB). As the mask 15, for example, a substrate made of a material such as glass or quartz that transmits light having an exposure wavelength, in which a light-shielding film such as a chromium film is formed in accordance with the pattern of the recess and the ejection orifice, can be used. As an exposure apparatus, a projection exposure apparatus including a light source having a single wavelength such as an i-line exposure stepper or a KrF stepper or a light source having a broad wavelength of a mercury lamp such as a mask aligner MPA-600 Super (trade name; manufactured by Canon, Inc.) can be used. The exposure amount may be set to, for example, from 500 to 6,000 J/m$^2$ although depending on the sensitivity of the negative photosensitive resin compositions.

In the case where the size of the pattern of the mask 15 is aligned with the width of the opening of the recess 10 as illustrated in FIG. 3B, the pattern conversion ratio of the negative photosensitive resin composition B forming the second resin layer 14 is set to 1:1 with respect to the pattern of the mask 15. The sensitivity of the negative photosensitive resin composition A forming the first resin layer 13 is higher than that of the negative photosensitive resin composition B. Therefore, when the negative photosensitive resin composition A and the negative photosensitive resin composition B are subjected to exposure collectively, the width of the ejection orifice 7 becomes smaller than the width of the opening of the recess 10 patterned with the same size as that of the pattern of the mask 15. Thus, a level difference is formed. On the other hand, in the case where the size of the pattern of the mask 15 is aligned with the width of the ejection orifice 7 as illustrated in FIG. 4, the pattern conversion ratio of the negative photosensitive resin composition A is set to 1:1 with respect to the pattern of the mask 15. The sensitivity of the negative photosensitive resin composition B is lower than that of the negative photosensitive resin composition A. Therefore, when the negative photosensitive resin composition A and the negative photosensitive resin composition B are subjected to exposure collectively, the width of the opening of the recess 10 becomes larger than that of the ejection orifice 7 patterned with the same size as that of the pattern of the mask 15. Thus, a level difference is formed.

Further, the shape of the ejection orifice 7 determined by the pattern of the mask 15 is not required to be a circle and can be appropriately selected in consideration of ejection characteristics and the like. As the shape of the ejection orifice 7, for example, there are given shapes illustrated in FIGS. 5A to 5C. In particular, by using the ejection orifice 7 having protrusions 16 formed therein as illustrated in FIG. 5C, a liquid is held between the protrusions 16 so that the division of a liquid droplet into a plurality of liquid droplets (main droplet and satellites) is significantly suppressed during ejection of liquid droplets. As a result, printing of high quality can be realized.

Figure 6A:
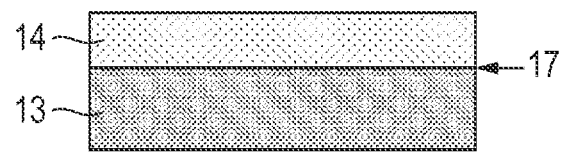
FIGS. 6A, 6B, and 6C are sectional views illustrating still another example of the manufacturing method for a liquid ejection head according to the present invention.
Figure 6B:
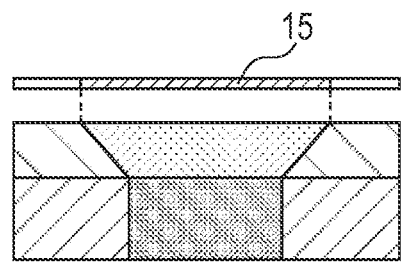
Figure 6C:
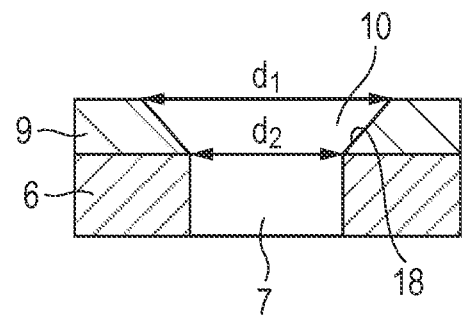

Further, the wall surface of the recess 10 is not necessarily required to be perpendicular to the substrate and may have inclination as illustrated in FIG. 6C. In the case where the negative photosensitive resin composition B contains a water-repellent agent, when the wall surface of the recess 10 is perpendicular to the substrate, a bottom surface of the recess 10 illustrated in FIG. 3C does not have water repellency. On the other hand, when the wall surface of the recess 10 has inclination, the recess 10 does not have a bottom surface as illustrated in FIG. 6C, and a wall surface 18 of the recess 10 having inclination has water repellency over the entire surface. Therefore, the water repellency of the periphery of the ejection orifice 7 is enhanced. As a method of allowing the wall surface of the recess 10 to have inclination, there is given a method involving performing heat treatment at a temperature equal to or higher than a softening point of the negative photosensitive resin A contained in the negative photosensitive resin composition A so as to compatibilize an interface between the first resin layer 13 and the second resin layer 14 after forming the second resin layer 14 and before performing the pattern exposure. According to this method, the sensitivity gradient can be formed easily from the first resin layer 13 having high sensitivity to the second resin layer 14 having low sensitivity, and the wall surface of the recess 10 has inclination as illustrated in FIG. 6B. It is to be noted that the softening point of the negative photosensitive resin is a value measured with TMA/SS-6000 (trade name; manufactured by Seiko Instruments Inc.). It is preferred that the heat treatment temperature fall within a range of 0° C. or more and 20° C. or less with respect to the softening point of the negative photosensitive resin A.

Next, the first resin layer 13 and the second resin layer 14 are subjected to development treatment collectively (FIG. 3C). For the development treatment, an organic solvent or the like may be used. With this, uncured portions of the first resin layer 13 and the second resin layer 14 are removed, and the ejection orifice forming member 6, the surface layer 9, the ejection orifice 7, and the recess 10 are formed.

It is to be noted that the formation of the flow path of the liquid, the formation of the supply port of the liquid, the electrical connection for driving the energy generating elements, the coupling of a member such as a chip tank for supplying the liquid, and the like may be performed by known methods. Accordingly, the liquid ejection head according to this embodiment is completed.

[Liquid Ejection Head]

The liquid ejection head according to the present invention includes: a substrate; an ejection orifice forming member having an ejection orifice configured to eject a liquid, the ejection orifice forming member being formed on the substrate; and a surface layer having a recess that has a bottom portion communicating with the ejection orifice and an opening held in contact with an outside and having a width larger than that of the ejection orifice, the surface layer being formed on the ejection orifice forming member. The ejection orifice forming member and the surface layer include a cured product of a negative photosensitive resin. The liquid ejection head can be manufactured by the manufacturing method for a liquid ejection head according to the present invention. In the liquid ejection head, the ejection orifice forming member and the surface layer include a cured product of a negative photosensitive resin, and hence have high adhesion therebetween. Thus, the liquid ejection head has high durability.

EXAMPLES

Now, the present invention is described in more detail by way of Examples. The liquid ejection head was evaluated by the following method.

[Evaluation of Liquid Ejection Head]

The liquid ejection head thus manufactured was wiped with a blade 0 times, 10,000 times, and 30,000 times. The printing quality in each case was checked. As a printing pattern, a pattern enabling the ejection of ink, non-ejection of ink, printing kink, and the like at each ejection orifice to be confirmed was used. The evaluation was made based on the following criteria.

○: No printing kink is recognized.

Δ: Although recognized, printing kink is acceptable.

x: Printing kink is recognized.

Example 1

An ejection orifice forming member and the like of a liquid ejection head were produced through steps illustrated in FIGS. 3A to 3C. A cationically polymerizable epoxy resin composition having a composition shown in Table 1 was applied onto a substrate so as to form a first resin layer 13. A cationically polymerizable epoxy resin composition having a composition shown in Table 2 was applied onto the first resin layer 13 by a slit coating method so as to form a second resin layer 14 having a thickness of 0.5 μm. Then, the resultant was subjected to heat treatment at 40° C. for 5 minutes (FIG. 3A).

TABLE 1

| Epoxy resin | Trade name: 157S70; manufactured by Mitsubishi Chemical Corporation | 100 Parts by mass |
| --- | --- | --- |
| Photoacid generator | Trade name: LW-S1; manufactured by San-Apro Ltd. | 1 Part by mass |
| Solvent | PGMEA; manufactured by Kishida Chemical Co., Ltd. | 20 Parts by mass |

TABLE 2

| Epoxy resin | Trade name: EHPE-3150; manufactured by Daicel Corporation | 100 Parts by mass |
| --- | --- | --- |
| Photoacid generator | Trade name: LW-S1; manufactured by San-Apro Ltd. | 0.01 Part by mass |
| Solvent | Ethanol; manufactured by Kishida Chemical Co., Ltd. | 20 Parts by mass |

Next, the first resin layer 13 and the second resin layer 14 were subjected to pattern exposure collectively through a mask 15 having a pattern of a recess (FIG. 3B). As an exposure apparatus, an i-line exposure stepper (manufactured by Canon, Inc.) was used. The exposure amount was 1,300 J/m². After that, the exposed portion was cured by performing PEB.

Next, uncured portions of the first resin layer and the second resin layer 14 were removed by being dissolved in PGMEA. Thus, an ejection orifice forming member 6, a surface layer 9, an ejection orifice 7, and a recess 10 were formed (FIG. 3C). In this case, the $d_1/d_2$ ratio was 1.3. Further, $d_3/d_1$ was 1.2.

It is to be noted that the formation of a flow path of a liquid, the formation of a supply port of the liquid, the electrical connection for driving energy generating elements, the coupling of a member such as a chip tank for supplying the liquid, and the like were performed by ordinary methods. Accordingly, a liquid ejection head was completed. Table 8 shows the evaluation results of the liquid ejection head.

Example 2

A liquid ejection head was manufactured through the same steps as those of Example 1, except for forming the first resin layer 13 by applying a cationically polymerizable epoxy resin composition having a composition shown in Table 3 onto the substrate, in place of the cationically polymerizable epoxy resin composition having a composition shown in Table 1. Then, the liquid ejection head was evaluated. Table 8 shows the evaluation results. It is to be noted that the $d_1/d_2$ ratio was 1.5.

TABLE 3

| Epoxy resin | Trade name: 157S70; manufactured by Mitsubishi Chemical Corporation | 100 Parts by mass |
| --- | --- | --- |
| Photoacid generator | Trade name: LW-S1; manufactured by San-Apro Ltd. | 1.6 Parts by mass |
| Solvent | PGMEA; manufactured by Kishida Chemical Co., Ltd. | 20 Parts by mass |

Example 3

A liquid ejection head was manufactured through the same steps as those of Example 1, except for forming the first resin layer 13 by applying a cationically polymerizable epoxy resin composition having a composition shown in Table 4 onto the substrate, in place of the cationically polymerizable epoxy resin composition having a composition shown in Table 1. Then, the liquid ejection head was evaluated. Table 8 shows the evaluation results. It is to be noted that the $d_1/d_2$ ratio was 2.0.

TABLE 4

| Epoxy resin | Trade name: 157S70; manufactured by Mitsubishi Chemical Corporation | 100 Parts by mass |
| --- | --- | --- |
| Photoacid generator | Trade name: LW-S1; manufactured by San-Apro Ltd. | 3 Parts by mass |
| Solvent | PGMEA; manufactured by Kishida Chemical Co., Ltd. | 20 Parts by mass |

Example 4

An ejection orifice forming member and the like of a liquid ejection head were produced through steps illustrated in FIGS. 6A to 6C. A cationically polymerizable epoxy resin composition having a composition shown in Table 1 was applied onto a substrate so as to form a first resin layer 13. A cationically polymerizable epoxy resin composition having a composition shown in Table 2 was applied onto the first resin layer 13 by a slit coating method so as to form a second resin layer 14 having a thickness of 0.5 μm. Then, the resultant was subjected to heat treatment at 70° C. for 3 minutes (FIG. 6A). In this case, 157S70 and EPHE-3150 both had a softening point of 70° C. that was matched with the temperature of the heat treatment. Therefore, an interface 17 between the first resin layer 13 and the second resin layer 14 was compatibilized.

After that, a liquid ejection head was manufactured through the same steps as those of Example 1. Then, the liquid ejection head was evaluated. Table 8 shows the evaluation results. In this example, the interface 17 between the first resin layer 13 and the second resin layer 14 was compatibilized, and hence a wall surface 18 of a recess 10 had inclination as illustrated in FIG. 6C. It is to be noted that the $d_1/d_2$ ratio was 1.3.

Example 5

A liquid ejection head was manufactured through the same steps as those of Example 4, except for forming the first resin layer 13 by applying a cationically polymerizable epoxy resin composition having a composition shown in Table 3 onto the substrate, in place of the cationically polymerizable epoxy resin composition having a composition shown in Table 1. Then, the liquid ejection head was evaluated. Table 8 shows the evaluation results. It is to be noted that the interface 17 between the first resin layer 13 and the second resin layer 14 was compatibilized during heat treatment, and hence the wall surface 18 of the recess 10 had inclination as illustrated in FIG. 6C. Further, the $d_1/d_2$ ratio was 1.5.

Example 6

A liquid ejection head was manufactured through the same steps as those of Example 4, except for forming the first resin layer 13 by applying a cationically polymerizable epoxy resin composition having a composition shown in Table 4 onto the substrate, in place of the cationically polymerizable epoxy resin composition having a composition shown in Table 1. Then, the liquid ejection head was evaluated. Table 8 shows the evaluation results. It is to be noted that the interface 17 between the first resin layer 13 and the second resin layer 14 was compatibilized during heat treatment, and hence the wall surface 18 of the recess 10 had inclination as illustrated in FIG. 6C. Further, the $d_1/d_2$ ratio was 2.0.

Example 7

A liquid ejection head was manufactured through the same steps as those of Example 1, except for forming the second resin layer 14 by applying a water-repellent agent-containing cationically polymerizable epoxy resin composition having a composition shown in Table 5 onto the substrate, in place of the cationically polymerizable epoxy resin composition having a composition shown in Table 2. Then, the liquid ejection head was evaluated. Table 8 shows the evaluation results. It is to be noted that the following composition was used as the water-repellent agent: a composition obtained by producing a hydrolyzable condensed product with glycidylpropyltriethoxysilane, methyltriethoxysilane, 2-perfluorodecylethyltriethoxysilane, water, and ethanol, and diluting the hydrolyzable condensed product with ethanol so that the content of its nonvolatile substance was 30 mass %. In addition, the $d_1/d_2$ ratio was 1.3.

TABLE 5

| Epoxy resin | Trade name: EHPE-3150; manufactured by Daicel Corporation | 100 Parts by mass |
| --- | --- | --- |
| Photoacid generator | Trade name: LW-S1; manufactured by San-Apro Ltd. | 0.01 Part by mass |
| Water-repellent agent | The above-mentioned composition | 3 Parts by mass |
| Solvent | Ethanol; manufactured by Kishida Chemical Co., Ltd. | 20 Parts by mass |

Example 8

A liquid ejection head was manufactured through the same steps as those of Example 7, except for forming the first resin layer 13 by applying a cationically polymerizable epoxy resin composition having a composition shown in Table 3 onto the substrate, in place of the cationically polymerizable epoxy resin composition having a composition shown in Table 1. Then, the liquid ejection head was evaluated. Table 8 shows the evaluation results. It is to be noted that the $d_1/d_2$ ratio was 1.5.

Example 9

A liquid ejection head was manufactured through the same steps as those of Example 7, except for forming the first resin layer 13 by applying a cationically polymerizable epoxy resin composition having a composition shown in Table 4 onto the substrate, in place of the cationically polymerizable epoxy resin composition having a composition shown in Table 1. Then, the liquid ejection head was evaluated. Table 8 shows the evaluation results. It is to be noted that the $d_1/d_2$ ratio was 2.0.

Example 10

A liquid ejection head was manufactured through the same steps as those of Example 4, except for forming the second resin layer 14 by applying a water-repellent agent-containing cationically polymerizable epoxy resin composition having a composition shown in Table 5 onto the substrate, in place of the cationically polymerizable epoxy resin composition having a composition shown in Table 2. Then, the liquid ejection head was evaluated. Table 8 shows the evaluation results. It is to be noted that the interface 17 between the first resin layer 13 and the second resin layer 14 was compatibilized during heat treatment, and hence the wall surface 18 of the recess 10 had inclination as illustrated in FIG. 6C. Further, the $d_1/d_2$ ratio was 1.3.

Example 11

A liquid ejection head was manufactured through the same steps as those of Example 10, except for forming the first resin layer 13 by applying a cationically polymerizable epoxy resin composition having a composition shown in Table 3 onto the substrate, in place of the cationically polymerizable epoxy resin composition having a composition shown in Table 1. Then, the liquid ejection head was evaluated. Table 8 shows the evaluation results. It is to be noted that the $d_1/d_2$ ratio was 1.5.

Example 12

A liquid ejection head was manufactured through the same steps as those of Example 10, except for forming the first resin layer 13 by applying a cationically polymerizable epoxy resin composition having a composition shown in Table 4 onto the substrate, in place of the cationically polymerizable epoxy resin composition having a composition shown in Table 1. Then, the liquid ejection head was evaluated. Table 8 shows the evaluation results. It is to be noted that the $d_1/d_2$ ratio was 2.0.

Example 13

A liquid ejection head was manufactured through the same steps as those of Example 1, except for forming the first resin layer 13 by applying a cationically polymerizable epoxy resin composition having a composition shown in Table 6 onto the substrate, in place of the cationically polymerizable epoxy resin composition having a composition shown in Table 1. Then, the liquid ejection head was evaluated. Table 8 shows the evaluation results. It is to be noted that the $d_1/d_2$ ratio was 2.1.

TABLE 6

| Epoxy resin | Trade name: 157S70; manufactured by Mitsubishi Chemical Corporation | 100 Parts by mass |
| --- | --- | --- |
| Photoacid generator | Trade name: LW-S1; manufactured by San-Apro Ltd. | 3.2 Parts by mass |
| Solvent | PGMEA; manufactured by Kishida Chemical Co., Ltd. | 20 Parts by mass |

Example 14

A liquid ejection head was manufactured through the same steps as those of Example 7, except for forming the first resin layer 13 by applying a cationically polymerizable epoxy resin composition having a composition shown in Table 6 onto the substrate, in place of the cationically polymerizable epoxy resin composition having a composition shown in Table 1. Then, the liquid ejection head was evaluated. Table 8 shows the evaluation results. It is to be noted that the $d_1/d_2$ ratio was 2.1.

Example 15

A liquid ejection head was manufactured through the same steps as those of Example 4, except for forming the first resin layer 13 by applying a cationically polymerizable epoxy resin composition having a composition shown in Table 6 onto the substrate, in place of the cationically polymerizable epoxy resin composition having a composition shown in Table 1. Then, the liquid ejection head was evaluated. Table 8 shows the evaluation results. It is to be noted that the interface 17 between the first resin layer 13 and the second resin layer 14 was compatibilized during heat treatment, and hence the wall surface 18 of the recess 10 had inclination as illustrated in FIG. 6C. Further, the $d_1/d_2$ ratio was 2.1.

Example 16

A liquid ejection head was manufactured through the same steps as those of Example 10, except for forming the first resin layer 13 by applying a cationically polymerizable epoxy resin composition having a composition shown in Table 6 onto the substrate, in place of the cationically polymerizable epoxy resin composition having a composition shown in Table 1. Then, the liquid ejection head was evaluated. Table 8 shows the evaluation results. It is to be noted that the interface 17 between the first resin layer 13 and the second resin layer 14 was compatibilized during heat treatment, and hence the wall surface 18 of the recess 10 had inclination as illustrated in FIG. 6C. Further, the $d_1/d_2$ ratio was 2.1.

Example 17

A liquid ejection head was manufactured through the same steps as those of Example 1, except for forming the first resin layer 13 by applying a cationically polymerizable epoxy resin composition having a composition shown in Table 7 onto the substrate, in place of the cationically polymerizable epoxy resin composition having a composition shown in Table 1. Then, the liquid ejection head was evaluated. Table 8 shows the evaluation results. It is to be noted that the $d_1/d_2$ ratio was 1.2.

TABLE 7

| Epoxy resin | Trade name: 157S70; manufactured by Mitsubishi Chemical Corporation | 100 Parts by mass |
| --- | --- | --- |
| Photoacid generator | Trade name: LW-S1; manufactured by San-Apro Ltd. | 0.8 Part by mass |
| Solvent | PGMEA, manufactured by Kishida Chemical Co., Ltd. | 20 Parts by mass |

Example 18

A liquid ejection head was manufactured through the same steps as those of Example 7, except for forming the first resin layer 13 by applying a cationically polymerizable epoxy resin composition having a composition shown in Table 7 onto the substrate, in place of the cationically polymerizable epoxy resin composition having a composition shown in Table 1. Then, the liquid ejection head was evaluated. Table 8 shows the evaluation results. It is to be noted that the $d_1/d_2$ ratio was 1.2.

Example 19

A liquid ejection head was manufactured through the same steps as those of Example 4, except for forming the first resin layer 13 by applying a cationically polymerizable epoxy resin composition having a composition shown in Table 7 onto the substrate, in place of the cationically polymerizable epoxy resin composition having a composition shown in Table 1. Then, the liquid ejection head was evaluated. Table 8 shows the evaluation results. It is to be noted that the interface 17 between the first resin layer 13 and the second resin layer 14 was compatibilized during heat treatment, and hence the wall surface 18 of the recess 10 had inclination as illustrated in FIG. 6C. Further, the $d_1/d_2$ ratio was 1.2.

Example 20

A liquid ejection head was manufactured through the same steps as those of Example 10, except for forming the first resin layer 13 by applying a cationically polymerizable epoxy resin composition having a composition shown in Table 7 onto the substrate, in place of the cationically polymerizable epoxy resin composition having a composition shown in Table 1. Then, the liquid ejection head was evaluated. Table 8 shows the evaluation results. It is to be noted that the interface 17 between the first resin layer 13 and the second resin layer 14 was compatibilized during heat treatment, and hence the wall surface 18 of the recess 10 had inclination as illustrated in FIG. 6C. Further, the $d_1/d_2$ ratio was 1.2.

Comparative Example 1

Figure 7A:
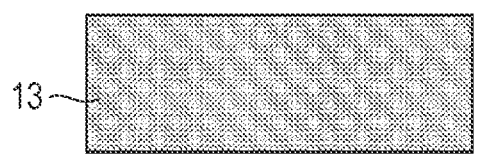
FIGS. 7A, 7B, and 7C are sectional views illustrating a manufacturing method for a liquid ejection head according to Comparative Example 1.
Figure 7B:
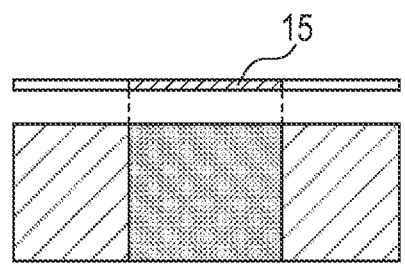
Figure 7C:
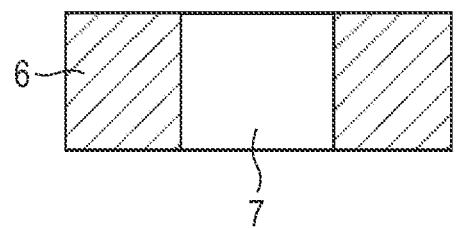

An ejection orifice forming member and the like of a liquid ejection head were produced through steps illustrated in FIGS. 7A to 7C. A cationically polymerizable epoxy resin composition having a composition shown in Table 1 was applied onto a substrate so as to form a first resin layer 13 (FIG. 7A).

Next, the first resin layer 13 was subjected to pattern exposure through a mask 15 (FIG. 7B). As an exposure apparatus, an i-line exposure stepper (manufactured by Canon, Inc.) was used. The exposure amount was 1,300 J/m². After that, the exposed portion was cured by performing PEB.

Next, an uncured portion of the first resin layer was removed by being dissolved in PGMEA. Thus, an ejection orifice forming member 6 and an ejection orifice 7 were formed (FIG. 7C).

It is to be noted that the formation of a flow path of a liquid, the formation of a supply port of the liquid, the electrical connection for driving energy generating elements, the coupling of a member such as a chip tank for supplying the liquid, and the like were performed by ordinary methods. Accordingly, a liquid ejection head was completed. Table 8 shows the evaluation results of the liquid ejection head.

Comparative Example 2

Figure 8A:
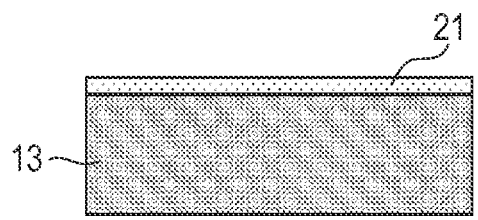
FIGS. 8A, 8B, and 8C are sectional views illustrating a manufacturing method for a liquid ejection head according to Comparative Example 2.
Figure 8B:
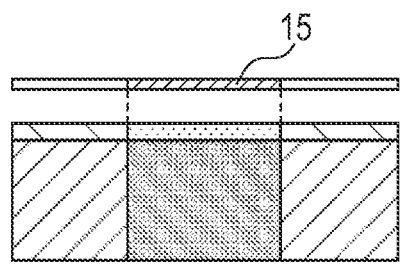
Figure 8C:
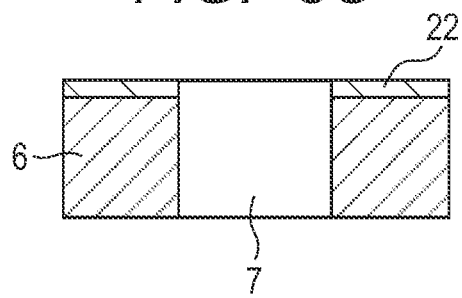

An ejection orifice forming member and the like of a liquid ejection head were produced through steps illustrated in FIGS. 8A to 8C. A cationically polymerizable epoxy resin composition having a composition shown in Table 1 was applied onto a substrate so as to form a first resin layer 13. After that, the following composition was used as the water-repellent agent to subject a surface of the first resin layer 13 to water-repellent treatment: a composition obtained by producing a hydrolyzable condensed product with glycidylpropyltriethoxysilane, methyltriethoxysilane, 2-perfluorodecylethyltriethoxysilane, water, and ethanol, and diluting the hydrolyzable condensed product with ethanol so that the content of its nonvolatile substance was 30 mass %. In addition, the $d_1/d_2$ ratio was 1.3. Thus, a water-repellent layer 21 was formed (FIG. 8A).

Next, the first resin layer 13 was subjected to pattern exposure through a mask 15 (FIG. 8B). As an exposure apparatus, an i-line exposure stepper (manufactured by Canon, Inc.) was used. The exposure amount was 1,300 J/m². After that, the exposed portion was cured by performing PEB.

Next, an uncured portion of the first resin layer was removed by being dissolved in PGMEA. Thus, an ejection orifice forming member 6, an ejection orifice 7, and a water-repellent treatment layer 22 were formed (FIG. 8C).

It is to be noted that the formation of a flow path of a liquid, the formation of a supply port of the liquid, the electrical connection for driving energy generating elements, the coupling of a member such as a chip tank for supplying the liquid, and the like were performed by ordinary methods. Accordingly, a liquid ejection head was completed. Table 8 shows the evaluation results of the liquid ejection head.

In comparison between Examples 1 to 6, 13, 15, 17, and 19 not using a water-repellent agent and Comparative Example 1 not using a water-repellent agent, it was confirmed that the printing quality was degraded when wiping was performed 10,000 times in Comparative Example 1. Further, in comparison between Examples 7 to 12, 14, 16, 18, and 20 using a water-repellent agent and Comparative Example 2 using a water-repellent agent, it was confirmed that the printing quality was slightly degraded when wiping was performed 10,000 times in Comparative Example 2. The reason for those results is considered as follows: the periphery of the opening of the ejection orifice was worn away to be degraded along with an increase in number of times of wiping, and hence the ejection of liquid droplets became unstable. On the other hand, in the liquid ejection heads according to Examples of the present invention, the degradation in printing quality was suppressed, as compared to Comparative Examples. Further, in Examples of the present invention, liquid ejection heads were able to be manufactured with high precision.

TABLE 8

| | Negative photosensitive resin composition A | Negative photosensitive resin composition B | Heat treatment temperature (° C.) | Water-repellent agent | $d_1/d_2$ ratio | Printing quality for each number of times of wiping | | |
|---|---|---|---|---|---|---|---|---|
| | | | | | | 0 times | 10,000 times | 30,000 times |
| Example 1 | Table 1 | Table 2 | 40 | Absent | 1.3 | ○ | ○ | Δ |
| Example 2 | Table 3 | Table 2 | 40 | Absent | 1.5 | ○ | ○ | Δ |
| Example 3 | Table 4 | Table 2 | 40 | Absent | 2.0 | ○ | ○ | Δ |
| Example 4 | Table 1 | Table 2 | 70 | Absent | 1.3 | ○ | ○ | Δ |
| Example 5 | Table 3 | Table 2 | 70 | Absent | 1.5 | ○ | ○ | Δ |
| Example 6 | Table 4 | Table 2 | 70 | Absent | 2.0 | ○ | ○ | Δ |
| Example 7 | Table 1 | Table 5 | 40 | Present | 1.3 | ○ | ○ | ○ |
| Example 8 | Table 3 | Table 5 | 40 | Present | 1.5 | ○ | ○ | ○ |
| Example 9 | Table 4 | Table 5 | 40 | Present | 2.0 | ○ | ○ | ○ |
| Example 10 | Table 1 | Table 5 | 70 | Present | 1.3 | ○ | ○ | ○ |
| Example 11 | Table 3 | Table 5 | 70 | Present | 1.5 | ○ | ○ | ○ |
| Example 12 | Table 4 | Table 5 | 70 | Present | 2.0 | ○ | ○ | ○ |
| Example 13 | Table 6 | Table 2 | 40 | Absent | 2.1 | ○ | Δ | x |
| Example 14 | Table 6 | Table 5 | 40 | Present | 2.1 | ○ | ○ | x |
| Example 15 | Table 6 | Table 2 | 70 | Absent | 2.1 | ○ | Δ | x |
| Example 16 | Table 6 | Table 5 | 70 | Present | 2.1 | ○ | ○ | x |
| Example 17 | Table 7 | Table 2 | 40 | Absent | 1.2 | ○ | Δ | x |
| Example 18 | Table 7 | Table 5 | 40 | Present | 1.2 | ○ | ○ | x |
| Example 19 | Table 7 | Table 2 | 70 | Absent | 1.2 | ○ | Δ | x |
| Example 20 | Table 7 | Table 5 | 70 | Present | 1.2 | ○ | ○ | x |
| Comparative Example 1 | Table 1 | — | — | Absent | — | ○ | x | x |
| Comparative Example 2 | Table 1 | — | — | Present | — | ○ | Δ | x |

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-068276, filed Mar. 28, 2014, which is hereby incorporated by reference herein in its entirety.

What is claimed is:

1. A manufacturing method for a liquid ejection head, the liquid ejection head comprising:
    a substrate;
    an ejection orifice forming member having an ejection orifice configured to eject a liquid, the ejection orifice forming member being formed on a surface of the substrate; and
    a surface layer having a recess that has a bottom portion communicating with the ejection orifice and an opening held in contact with an outside and having a width larger than a width of the ejection orifice, the surface layer being formed on the ejection orifice forming member, the manufacturing method comprising:

forming a first resin layer serving as the ejection orifice forming member by applying a negative photosensitive resin composition A onto the surface of the substrate;

forming a second resin layer serving as the surface layer by applying a negative photosensitive resin composition B having sensitivity lower than sensitivity of the negative photosensitive resin composition A onto the first resin layer;

subjecting the first resin layer and the second resin layer to pattern exposure collectively; and subjecting the first resin layer and the second resin layer to development treatment collectively after the pattern exposure, thereby forming the recess in the second resin layer, the recess having a side surface inclined with respect to a direction perpendicular to the surface of the substrate.

2. The manufacturing method for a liquid ejection head according to claim 1, wherein the opening of the recess has a width that is 1.3 to 2.0 times a width of the ejection orifice.

3. The manufacturing method for a liquid ejection head according to claim 1, wherein the negative photosensitive resin composition A and the negative photosensitive resin composition B comprise a cationically polymerizable epoxy resin composition.

4. The manufacturing method for a liquid ejection head according to claim 1, wherein the negative photosensitive resin composition A and the negative photosensitive resin composition B comprise a cationically polymerizable resin having two or more epoxy groups and a photoacid generator.

5. The manufacturing method for a liquid ejection head according to claim 1, further comprising, after the forming a second resin layer and before the subjecting the first resin layer and the second resin layer to pattern exposure collectively, performing heat treatment at a temperature equal to or higher than a softening point of a negative photosensitive resin A contained in the negative photosensitive resin composition A so as to compatibilize an interface between the first resin layer and the second resin layer.

6. The manufacturing method for a liquid ejection head according to claim 1, wherein the surface layer comprises a water-repellent agent.

7. The manufacturing method for a liquid ejection head according to claim 6, wherein the water-repellent agent comprises a fluorine-containing compound.

* * * * *